United States Patent [19]

Reneric

[11] 4,352,094
[45] Sep. 28, 1982

[54] DEVICE FOR ACQUIRING AND AVERAGING SAMPLES OF A NOISY PERIODIC SIGNAL

[75] Inventor: Michel E. Reneric, Paris, France

[73] Assignee: Telediffusion de France, Paris, France

[21] Appl. No.: 242,623

[22] Filed: Mar. 11, 1981

[30] Foreign Application Priority Data

Mar. 17, 1980 [FR] France ................................ 80 05928

[51] Int. Cl.³ ............................................. H03K 13/02
[52] U.S. Cl. .............................. 340/347 AD; 364/575; 364/734; 364/811
[58] Field of Search .................... 340/347 M, 347 AD; 358/10; 364/575, 734, 811

[56] References Cited

U.S. PATENT DOCUMENTS 3,441,720  4/1969  Lazecki ............................... 364/734

*Primary Examiner*—Charles D. Miller
*Attorney, Agent, or Firm*—Lowe, King, Price & Becker

[57] ABSTRACT

In the error signal feature sensor of the device, an analog synthesized signal is produced throughout the first portion of each period of the analog noisy test signal to be acquired by means of the digital value of samples memorizing in a random access memory and a digital-to-analog converter. The noisy signal and the synthesized signal are compared therebetween at predetermined sampling times in predetermined number. The sign and modulus of the error signal in relation to a predetermined threshold voltage are written in the memory. During the second portion of the period without the noisy signal, a processing unit as a microprocessor calculates the new digital values of the samples in term of comparison results and the preceding digital values of the samples in accordance with a particular algorithm. A new comparison and calculation cycle is performed and so on. After acquisition in steady working, the synthesized signal coincides with the average value of the noisy signal at the predetermined sampling times.

9 Claims, 6 Drawing Figures

DEVICE FOR ACQUIRING AND AVERAGING SAMPLES OF A NOISY PERIODIC SIGNAL

BACKGROUND OF THE INVENTION

1. Field of the Invention

The present invention relates to a device for acquiring and averaging samples of a noisy periodic signal.

Although the scope of the invention is not restricted to the video signal transmission field the noisy periodic signal can be particularly one of the test signals inserted into specific lines of the field blanking interval of a video signal. The characteristics of these insertion test signals and the parameters to be measured therefrom for determining the quality of a video signal transmission system are specified in the recommandations A 473-2 (1970) and A 569 (1978) published by the International Radiocommunication Consultative Committee (CCIR).

2. Description of the Prior Art

Mesuring equipments already known in prior art measure automatically the distorsions that the insertion test signals undergo, and evaluate the signal quality at various points along the video signal transmission medium. These measuring equipments can be grouped into two categories.

Those in the first category, existing in by for the largest numbers, marketed by Rhode and Schwarz, a GEC-Marconi Electrics Company and Philips, employ conventional signal acquiring and averaging devices which primarily consist of the following circuits. A plurality of conventional analog sampling and holding circuits equal to the number of samples to be acquired is inserted at the noisy signal input. Each of these sampling and holding circuits is organized around a switch which is closed throughout the sampling period on a capacitor intended for storing the sampled voltage in the form of a direct voltage. Then, analog circuits for filtering the sampled voltages make it possible to average their fluctuations in the presence of random noise. After this filtering, analog calculating units which are made up of operational amplifiers for example, calculate the various parameters to be measured based on the sample voltages and deliver the signals representative of the parameters in the form of direct voltages. A slow analog-to-digital converter connected to the calculating unit output sequentially converts, in digital form, the direct voltages delivered by the calculating units. According to the first category then, it turns out that the parameters are first of all acquired in analog form, thereby constituting the drawback of utilizing relatively costly analog calculating units. As a result, the number of samples is reduced.

The measuring equipment in the second category, more recent and marketed by Tektronic, Inc. makes wider use of digital techniques. The noisy signal to be analysed is sampled at a very high frequency, above the Nyquist frequency. Each sample is instantaneously converted into a digital form by means of a fast analog-to-digital converter. The digital values in relation to each sample, for several successive noisy signal periods, are stored into a memory. At the end of these successive periods, a microprocessor reads the stored digital values for each sample and calculates for these successive periods the average value of the sample, in the mathematical meaning of the term. The value of the sample is then very inaccurate if the signal is highly noisy during said successive periods.

Furthermore, it is a known fact that the current fast analog-to-digital converters have a relatively low resolution, at most 8 bits per sample, which limits the accuracy of the sampling and consequently the averaging in the second category measuring equipment.

OBJECTS OF THE INVENTION

Therefore, it is an object of the present invention to provide a new and improved device for acquiring and averaging samples of an analog noisy periodic signal.

It is another object of the present invention to provide a noisy periodic signal acquiring and averaging device which includes a digital-to-analog converter having a high resolution and a cost less than an analog-to-digital converter.

It is a further object of the present invention to provide a noisy periodic signal acquiring and averaging device which enables the samples to be processed in digital form directly with a view to calculating the parameters.

It is still another object of the present invention to provide a noisy periodic signal acquiring and averaging device which includes a digital calculating unit working on the digital values of the samples to be acquired which essentially comprises digital components.

It is still another object of the present invention to provide a device for acquiring the sample digital values which is both fast and immune to random noise.

SUMMARY OF THE INVENTION

In accordance with the aforementioned objects, a device for acquiring and averaging samples of an analog noisy periodic signal whose period is made up of a first portion with a signal and a second portion without, comprises:

means for subtracting said first portion of said noisy signal from analog samples that are precalculated during the preceding second portion of said noisy signal to produce an analog error signal;

means for comparing said error signal with zero, a predetermined voltage threshold and the negative thereof to produce for each sample a first bit representative of the magnitude of the modulus of said error signal in relation to said voltage threshold and a second bit representative of the sign of said error signal;

first means for memorizing at least the precalculated digital values of said samples and said first and second bits;

means for reading and writing in synchronism each sample digital value and the first and second bits resulting from the comparisons at a predetermined recurrent time of said first signal portion;

means for converting said digital values of said samples into said analog samples; and digital means reading the memorized digital value of each sample and the first and second resulting bits for calculating a new sample digital value which is statistically closer to the corresponding amplitude of said periodic signal and for writing said new sample digital value into said first memorising means during at most said second signal portion.

The basic principle of the device embodying the invention is as follows. By means of digital values contained in a memory and by means of a digital-to-analog converter, an analog synthesized signal is produced during the first portion of each period of the noisy test signal. The synthesized and noisy signals are compared at predetermined sampling times the number and temporal position of which in the first period portion are selected in terms of the shape of the noisy signal, its spectrum and the nature of the measurements to be made.

The comparison results such as the error signal sign and the error signal modulus magnitude in relation to the predetermined voltage threshold are then written in the memory. During the second portion of each period corresponding to the absence of the noisy signal, such as the use field duration with regard to the acquisition of video insertion of test signal, a processing unit such as a microprocessor performs the calculation of new digital values of samples in terms of the comparison results and the digital values of the preceding samples in accordance with a particular algorithm. The new digital values of the samples are then converted once again into an analog signal form during the first portion of the following period.

In steady working, the synthesized signal coincides with the average value of the incoming noisy signal to be analyzed at the predetermined sampling times.

The calculating means making use of the special algorithm chiefly comprise first counting and comparing means receiving the first bit related to each sample for selecting a first increment or a second increment depending on whether or not a first number of times where the error signal modulus related to said sample is greater than said voltage threshold throughout consecutive preceding periods, is greater than or strictly less than a first predetermined number, second counting and comparing means receiving the second bit related to each sample and controlled by said first selecting means for selecting the second bit or a third bit depending on whether the first increment or the second increment is selected, the state of the third bit indicating a second number of times where the error signal related to said sample is strictly greater than or less than half a second predetermined number, arithmetic means for adding the digital value of the sample to or subtracting it from the first increment depending on whether the error signal related to said sample is positive or negative, or for adding the digital value of the sample to or subtracting it from the second increment depending on whether the second number of times is strictly greater than or less than half said second predetermined number, in order to produce the new digital value of the sample.

The algorithm used in the device embodying the invention for calculating the synthesized signal makes it possible to achieve an excellent compromise between the acquisition speed and the noise reduction. The digital values of the synthesized signal are available in a memory, after acquisition in steady operation, and can be used when calculating the parameters to be measured.

BRIEF DESCRIPTION OF THE DRAWING

Other objects and advantages of the present invention will become apparent by reading the following detailed description of preferred embodiment examples with reference to the accompanying drawings, in which.

DESCRIPTION OF THE PREFERRED EMBODIMENTS

Figure 1:
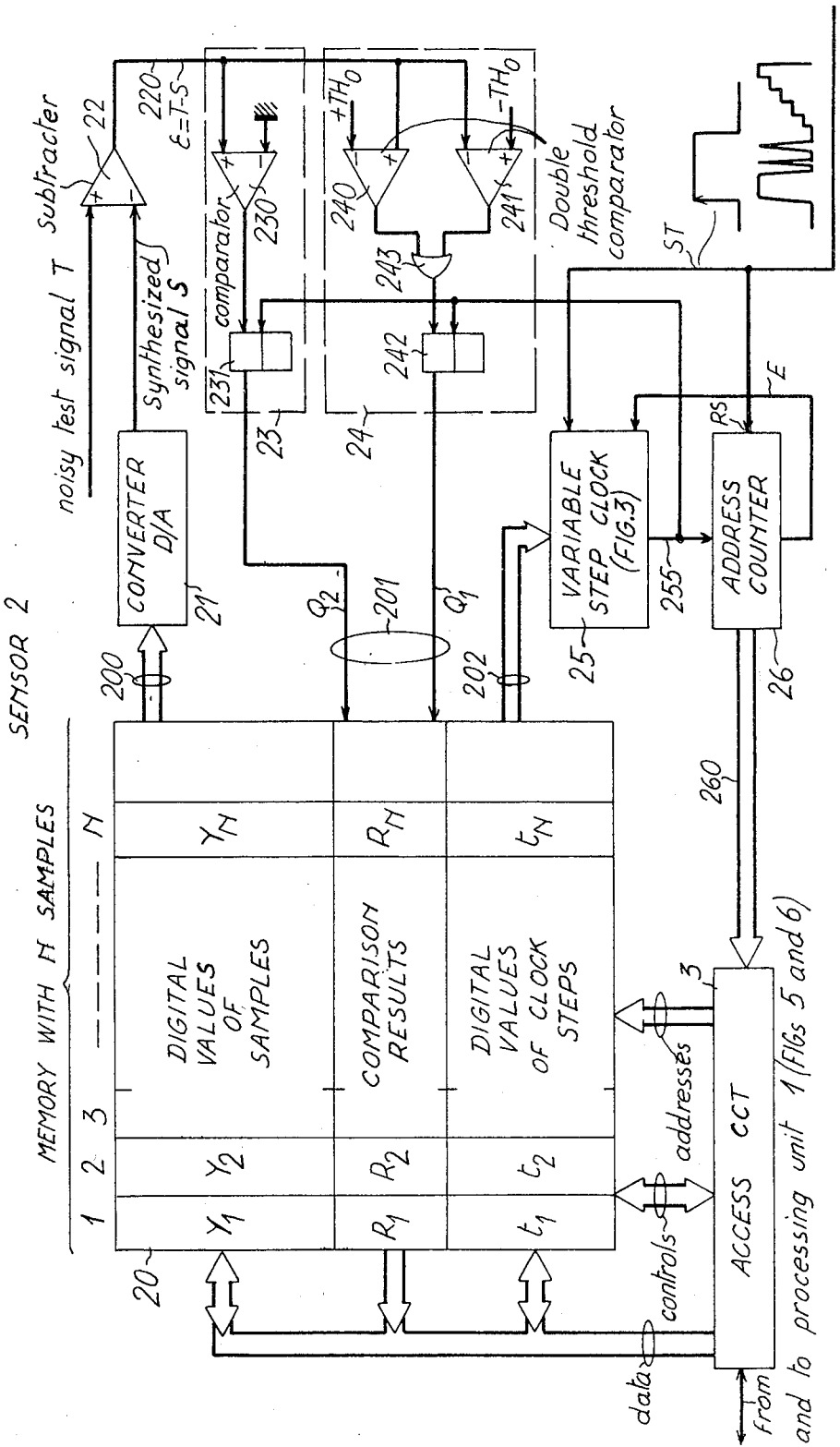
FIG. 1 is a schematic block diagram of the acquiring and averaging device sensor intended for acquiring the comparison results.

The acquiring and averaging device embodying the invention is chiefly made up of a processing unit 1 and a sensor 2. The processing unit 1 is intended for calculating the digital values of the synthesized signal samples and will be described in detail later on. The sensor 2 is depicted in FIG. 1 and is intended to sense the characteristics of the error signal for each sample. The error signal $\epsilon$ represents the difference between the synthesized signal calculated in the processing unit 1 and the noisy test signal T to be analyzed.

As shown in FIG. 1, sensor 2 is organized around a random-access memory 20 which is fully under the control of the processing unit 1 when the sensor 2 is not receiving the test signal T. The memory 20 is divided into three series of cells, Y, R and t, each of which is composed of a number of elementary cells equal to or greater than the integer number N of samples to be acquired. The first series $Y_1$ to $Y_N$ contains 12-bit words, for example, which represent the digital values of the samples. The second series of cells $R_1$ to $R_N$ contains 2-bit words $Q_1$, $Q_2$ which indicate the result of the synthesized-signal/test-signal comparisons. The state of first bit $Q_1$ of a word R indicates whether the modulus $|\epsilon|$ of the error signal $\epsilon$ is less than or greater than a predetermined threshold $TH_0$. The state of second bit $Q_2$ of a word R indicates the sign of the error signal $\epsilon$. The third series of cells $t_1$ to $t_N$ in the memory 20 contains 4-bit words, for example, which represent the digital values of the elementary time steps in a sampling cycle.

In the sensor 2, the comparison results for each sample are mainly obtained by means of components 21 to 24. The digital sample $Y_n$, where the integer n varies from 1 to N, is read after a period of time equal to $\Sigma_1^{n-1} t_n$ is the memory 20 which transmits the sample $Y_n$ via a 12-wire bus 200 to a digital-to-analog converter 21. The analog sample $S_n$ is transmitted from the converter 21 to the inverse input (−) of a subtractor 22. The direct input (+) of the subtracter 22 receives the periodic noisy test signal T. As already stated, this test signal can be a standard one such as the test signals which are inserted into line Nos. 17 to 22 of a video signal. For example, the test signal T has a period equal to the field period of 20 ms and has a first portion which has a duration $\Sigma_1^N t_n$ of approximately 0.38 ms, i.e. substantially equal to six line periods of 64 $\mu$s. The maximal available duration for processing the comparison results is at most equal to the second portion of the test signal period, i.e. $\simeq 19,6$ ms. The start of the test signal in this example is the instant which corresponds to the rising front half-amplitude point of the luminance bar of the test signal inserted in the line No. 17 of the video signal, as depicted above the wire ST on FIG. 1.

The output 220 of the substractor 22 supplies the analog sample $\epsilon_n$ of the error signal $\epsilon = T - S$. An example of error signal $\epsilon$ is shown on FIG. 2B for a synthesized signal S and a test signal T shown in FIG. 2A. The error signal is fed to the direct input (+) of a comparison-to-zero circuit 23 and to direct and inverse inputs (+) and (−) of a comparison-to-double-threshold circuit 24. Comparison circuits 23 and 24 conventionnally comprise operational amplifiers which operate as comparators. The circuit 23 comprises a zero-comparator 230 whose output signal is shown on FIG. 2C and is transmitted to a bistable flip-flop 231. The circuit 24 comprises two comparators 240 and 241 which compare the error signal $\epsilon$ with the value of the predetermined threshold $TH_0$ and its opposite value $-TH_0$, respectively. The output signals from the comparators 240 and 241 are depicted on FIGS. 2D and 2E. The circuit 24 further comprises a bistable flip-flop 242 whose input is linked to the outputs of the comparators 240 and 241 via an OR gate 243. The logic signal at the output of OR gate 243 is shown at FIG. 2F. It is in the high state if $|\epsilon| > TH_0$, which corresponds to the writing of a first bit $Q_1 = 1$ into the corresponding cell $R_n$ of the memory 20. The logic signal transmitted by the output of comparator 23 (FIG. 2C) is representative of the sign of the error signal $\epsilon$; it is in the high state if $\epsilon > 0$, which corresponds to the writing of a second bit $Q_2 = 1$ in the corresponding cell $R_n$. These two writings are made at the end of corresponding elementary step $t_n$ under the control of a clock signal 255 which is delivered to the clock inputs of the flip-flops 231 and 242.

Variable step $t_1$ to $t_N$ sampling is performed by means of a variable step clock 25 and an address counter 26. Digital values $t_1$ to $t_N$ are chosen beforehand in terms of the characteristics of the test signal portion to be analyzed which is included in said first portion of this signal.

Figure 3:
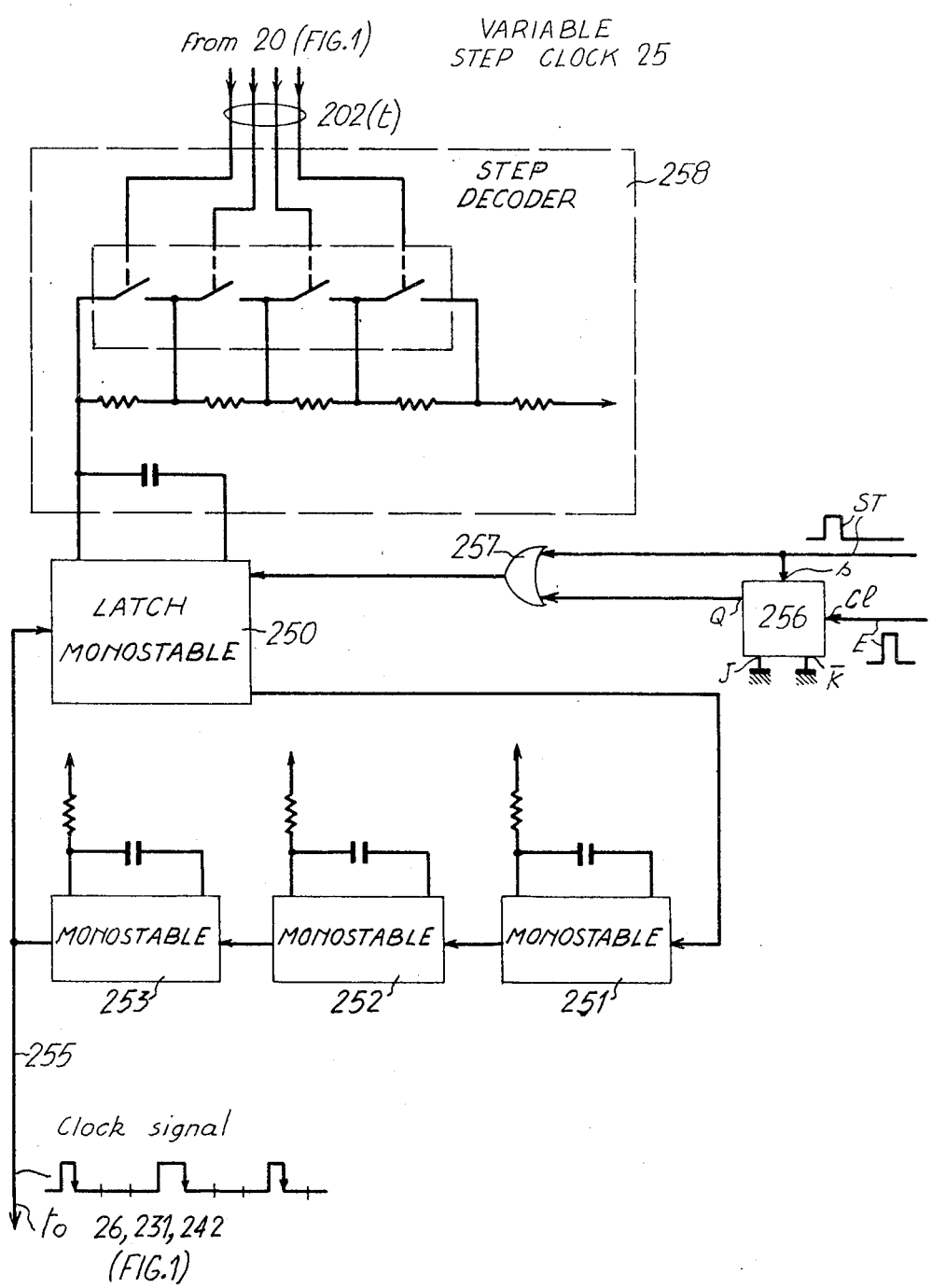
FIG. 3 is a detailed block diagram of a preferred example of the variable step clock of the sensor.

As illustrated on FIG. 3, the clock 25 comprises a loop of monostable flip-flops 250 to 253 which is unlocked during the time period separating two signals which define the start and the end of the first portion of the test signal to be acquired and which are applied to input terminals ST and E of the clock 25, respectively. The flip-flop loop comprises three monostable flip-flops 251 to 253 in series that are activated by a fall front at there inputs such that each generates a pulse of 1 $\mu$s for example. Three monostable flip-flops are used instead of one for temperature stability reasons. The input of the first monostable flip-flop 251 is connected to the output of the flip-flop 250 which is of bistable latch type. The output of the last flip-flop 253 forms the output 255 of the clock 25 which is connected to the input of the flip-flop 250 and also to the counting input of the address counter 26 and to the clock inputs of flip-flops 231 and 242 (FIG. 1).

The clock 25 also comprises a JK flip-flop 256 whose inputs J and $\overline{K}$ are at "0" state, and an OR gate 257 whose inputs are connected to the output Q of the flip-flop 256 and the input terminal ST of the clock 25 and whose output is connected to the locking control input of the flip-flop 250. The one-setting input s and clock input C1 of the flip-flop 256 are connected to the input terminals ST and E. The locking control input of the flip-flop 250 is in the high state and, as a result, the flip-flop 250 is unlocked, after a start pulse at the input terminal ST until the following end pulse at the input terminal E. The flip-flop 250 is then locked until the next start pulse, i.e. the clock 25 is stopped so that the memory 20 can be directed by the processing unit 1.

In the clock 25, a step decoder 258 receives, in parallel, the four bits of words $t_1$ to $t_N$ which are representative of the digital values of the elementary clock steps and which are delivered from the memory 20 on a bus 202 under the control of the address counter 26. The decoder 258 modifies the RC constant which determines the pulse width of latch flip-flop 250. According to FIG. 3, it comprises four switches which each selects or short-circuits a resistance in terms of the associated rank bit state in the received word $t_n$. It thus appears that the time period between two sampling operations is made up of a constant duration which is equal to the sum of 1 $\mu$s durations of the successive pulses which are supplied by the monostable flip-flops 251 to 253, and of the variable duration of the pulse which is supplied by the flip-flop 250.

Figure 4:
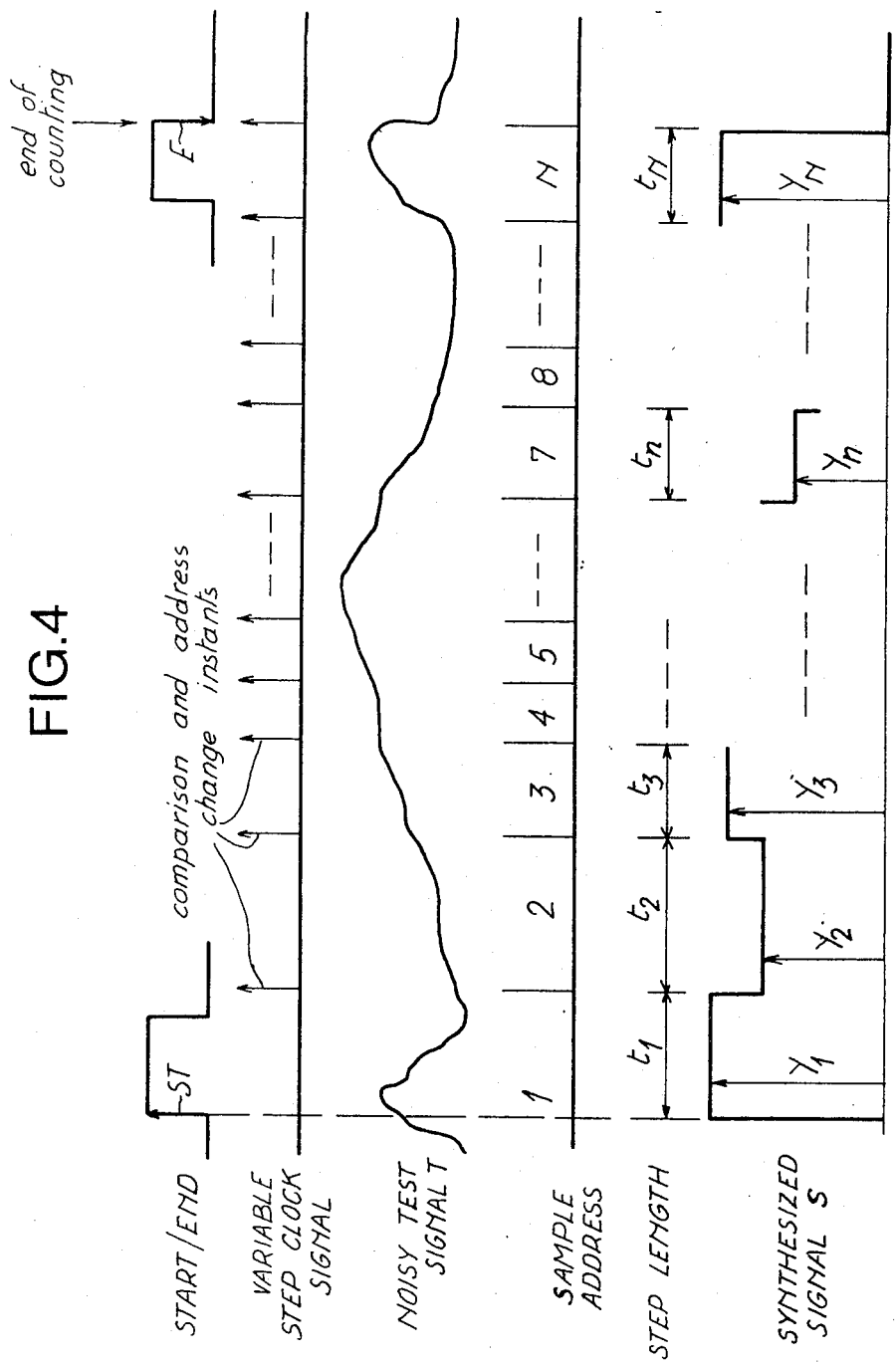
FIG. 4 is a waveform diagram illustrating variable step sampling.

As shown in FIGS. 1 and 4, the rise front of the start signal along the wire ST resets (RS) the address counter 26 to zero, and this counter transmits the addresses of first cells $Y_1$, $R_1$, $t_1$ via an access circuit 3. Step decoder 258 of clock 25 then receives word $t_1$ via bus 202. After a first step of duration $t_1$, corresponding to memorizing characteristics $Q_1$, $Q_2$ of the error signal related to the first sample, pulse at the output 255 from clock 25 controls the bistable flip-flops 231 and 242 and increments address counter 26 by one unit, which in turn transmits the addresses of cells $Y_2$, $R_2$ and $t_2$ related to the second sample along its output bus 260. These sequences of variable durations $t_1$ to $t_N$ follow on until the count in the address counter 26 is equal to N and the counter emits the end-of-cycle signal along wire E, thereby indicating that sampling has stopped in the sensor 2. This sampling will resume once a new start signal ST appears corresponding to the following period of test signal T.

Figure 5:
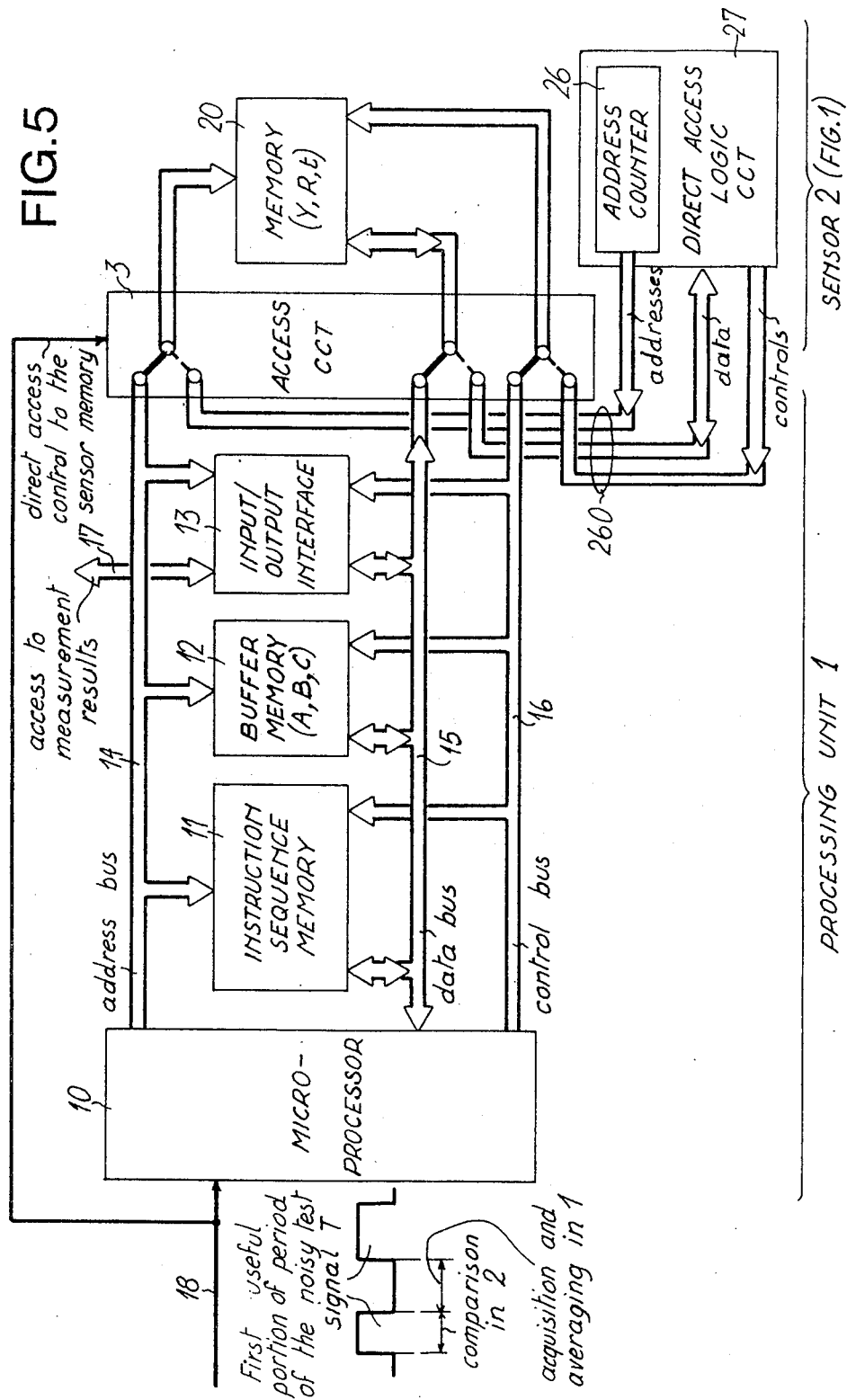
FIG. 5 is a schematic block diagram of the processing unit for averaging the samples including a microprocessor.

It will be noted for each cycle that the address counter 26 read addresses the cells Y and t and write addresses the cells R. In fact, as schematically shown in FIG. 5, the address counter 26 is included in an internal logic circuit 27 having access directly to the memory 20. This logic circuit 27 is connected through a bus 260 to the memory 20 via the access circuit 3 and delivers, in addition to the addresses under the control of the counter 26, certain data and commands such as instructions, dependent on the state of counter 26, to enable suitable reading and writing of the words contained in the memory 20. Words t representing the digital values of clock 25 steps are preprogrammed in the read-only memory of instruction sequences in the processing unit 1—as will be seen hereinafter—and are written in the corresponding cells of the memory 20 of sensor 2 during the second portion of each period of the noisy test signal T.

Figure 6:
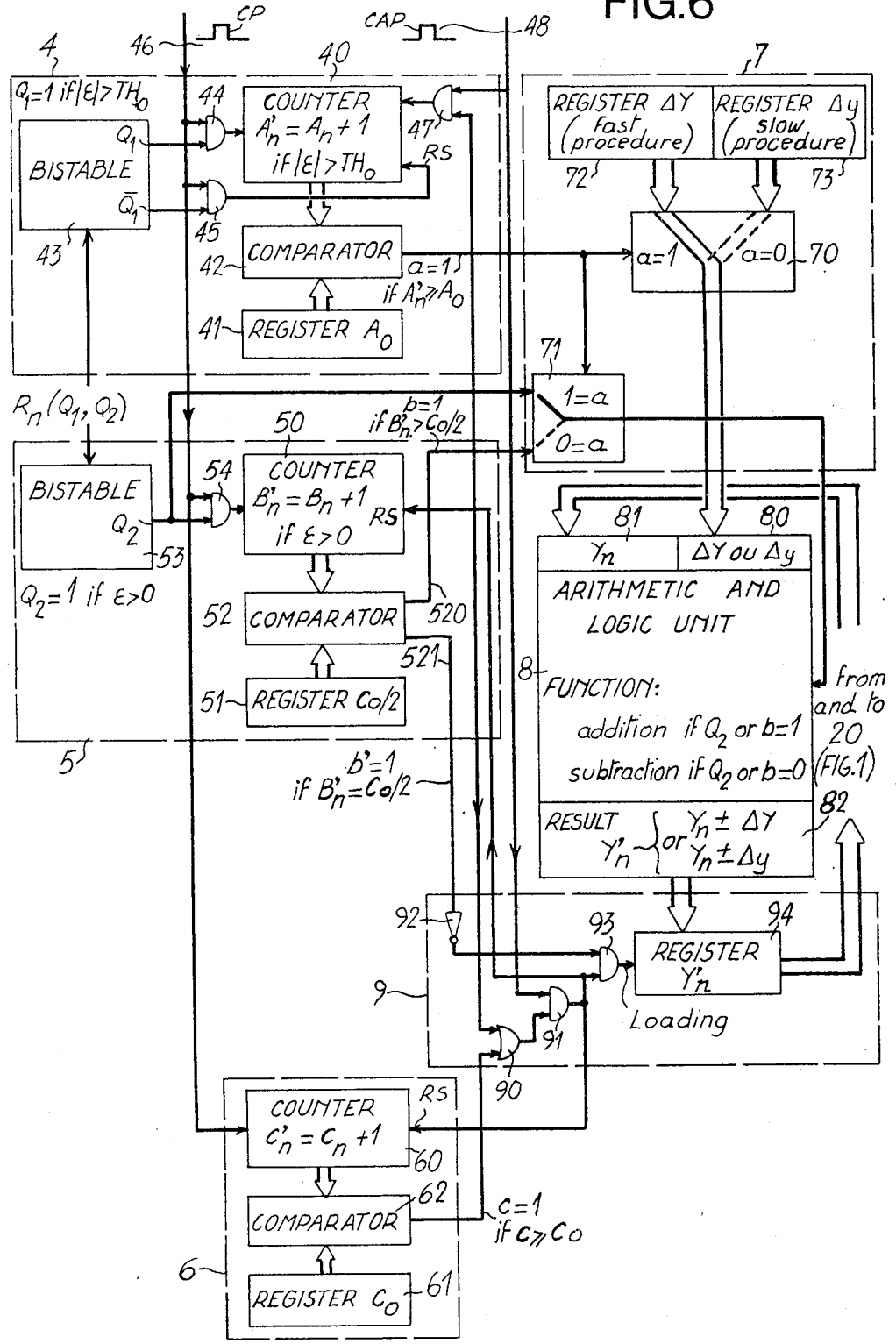
FIG. 6 is a detailed block diagram of a part of the processing unit for calculating the digital value of a sample using comparison results, according to a wired logic embodiment.

Referring now to FIG. 5 and then to FIG. 6, the processing unit 1 is described. It enables during each test signal T period, after end signal E, to calculate the new digital values Y of the samples so as to acquire the noise-free test signal by averaging.

As schematically shown in FIG. 5, the processing unit 1 is preferably organized around a microprocessor 10, of the INTEL 8080 or MOTOROLA 6800 type for example. As is well-known, this microprocessor 10 is associated with a read-only memory 11, a random access memory 12 acting as a buffer and an input/output interface 13. Circuit 11, 12 and 13 are connected to the microprocessor 10 as well as to the sample memory 20 of the sensor 2 by means of the access circuit 3, via a unidirectional address bus 14, a bidirectional data bus 15 and a unidirectional control bus 16. The memory 11 contains, over and above the various digital values t of the clock steps, the order sequences of the microprocessor 10 software which is peculiar to the sample acquisition and averaging calculations. The buffer memory 12 records certain iterative values A, B, C for each cycle of the programme corresponding to a test signal T period. The input/output interface 13 enables the results of the measurements made by digital calculations on the synthesized signal after the end of the acquisition procedure to be transmitted along a bus 17 to display means such as a printer or a visual display console (not shown).

Furthermore, the microprocessor 10 and the access circuit 3 receive an envelope signal of the test signal T along a wire 18 so that, throughout the signal duration (between ST and E), the access circuit 3 links the memory 20 to the direct access internal logic unit 27 of the sensor 2, via the bus 260, in order to set about calculating the characteristics of the error signal $\epsilon$ for each sample and so that, throughout a length of time less than or equal to the following time lapse where test signal T is absent, the buses 14, 15 and 16 are linked to the memory 20 and that the microprocessor reads the results of comparisons $R_1$ to $R_N$ and enters the new calculated values of samples $Y_1$ to $Y_N$.

In order to illustrate the operations performed by the microprocessor 10, FIG. 6 shows solely the calculating unit which is included in the processing unit as per a wired logic embodiment. The means of this calculating unit corresponds to the software operations of the microprocessor 10. It processes the result of comparisons $R = Q_1 Q_2$ and calculates the new value of each sample over the second portion of one test signal T period (between E and ST).

The calculating unit in FIG. 6 comprises for the most part three comparing circuits 4, 5 and 6, a sample deviation selecting circuit 7, an arithmetic and logic unit 8 and a logic circuit 9 for reinitializing the other circuits and transmitting the new value Y' of the sample.

Each of the comparing circuits 4, 5, 6 comprises a counter 40, 50, 60, a register 41, 51, 61 and a comparator 42, 52, 62 which compares the count of the counter and the content of the register for each sample, respectively. In the example given, the comparators compare 8-bit words.

The comparing circuit 4 also comprises a bistable flip-flop 43 whose output $Q_1$ is connected via an AND gate 44 to the counting input of the counter 40 and whose complementary output $\overline{Q}_1$ is connected via an AND gate 45 to the zero resetting (RS) input of the counter 40. A bistable flip-flop 53 is also included in the comparing circuit 5 and has its output $Q_2$ which is connected to the counting input of the counter 50 via an AND gate 54. The other inputs of the AND gates 44, 45, 54 as well as the counting input of the counter 60 are controlled by a so-called counting pulse CP which is transmitted along a wire 46 for initializing the start of calculations for each sample.

The comparing circuit 4 also comprises an AND gate 47 whose output is connected to the down-counting input of the counter 40. One of the inputs of the AND gate 47 is connected to the output of the comparator 42, which is itself connected to one of the inputs of an OR gate 90 of the logic circuit 9 and to the control input of switches 70 and 71 of the selecting circuit 7. The other input of the AND gate 47 is connected to a wire 48 which transmits so-called calculation pulses CAP towards an input of an AND gate 91 of the logic circuit 9 whose other input is connected to the output of the OR gate 90.

In the selecting circuit 7, switch 70 has two input buses linked to two registers 72 and 73 which are assigned to fast and slow procedures respectively, i.e. which include the high incrementation or decrementation rate $\Delta Y$ of sample and the low incrementation or decrementation rate $\Delta y$ of sample. The switch 70 selects the content of one of registers 72 and 73 depending on the logic state a of the output of the comparator 42 for transmitting it to a first buffer input register 80 of the arithmetic and logic unit 8. The switch 71 selects the output $Q_2$ of the flip-flop 53 or a first output 520 of the comparator 52 under the control of output logic state a of the comparator 42. If $a=1$ corresponding to a fast procedure, the switch 71 transmits state $Q_2$ of the output of flip-flop 53 so that the arithmetic unit 8 adds the content $\Delta Y$ of the register 72 to or subtracts it from the preceding digital value $Y_n$ of the sample depending on whether $Q_2=1$ or $Q_2=0$. If $a=1$ corresponding to a slow procedure, the switch 71 transmits the state b of the first output 520 of comparator 52 such that the arithmetic unit 8 adds the content $\Delta y$ of the register 73 to or subtracts it from the preceding digital value $Y_n$ depending on whether $b=1$ or $b=0$. The unit 8 comprises a second buffer input register 81 which containing the preceding digital value $Y_n$ of the sample, and a buffer output register 82 which receives the addition or subtraction result $Y_n'$.

The logic circuit 9 also comprises, in addition to the AND gate 91 and the OR gate 90, whose other input is connected to the output of the comparator 62, an inverter 92, an AND gate 93 and a register 94 in which is loaded the new sample value contained in the output register 82 under the control of the output of the gate 93. The output of the gate 91 controls the zero-resetting (RS) of the counters 50 and 60 and is linked to an input of the AND gate 93. The other input of the AND gate 93 is linked via the inverter 92 to a second output 521 of the comparator 52.

The algorithm will now be described for the acquisition and the averaging of a sample, i.e. corresponding to the microprocessor 10 software stored in the instruction sequence memory 11 (FIG. 5). This algorithm is valid for any sample Y. Moreover, to avoid cluttering up FIG. 6, certain electronic components have not been shown, namely those related to the input of these parameters concerned with contents $A_n$, $B_n$ and $C_n$ of the counters 40, 50 and 60 from the memory 12, content $Y_n$ of the input register 81 from the sensor memory 20 and those related to the output of content $Y_n$ from the register 94 to the memory 20. The means for transferring word $R_n = Q_1 Q_2$ from the memory 10 to the inputs of the flip-flops 43 and 53 have not been shown either. Pulses CP and CAP as well as others required for controlling certain components in FIG. 6 are assumed to be transmitted by a control unit and a clock with relation to the instruction memory 11.

To describe the algorithm related to a sample having the digital value $Y_n$, it is assumed, after the end of the first portion of a period of the test signal T which is followed by the second portion of the period for processing the sample $Y_1$ to $Y_{n-1}$, that the states of the counters 40, 50 and 60 are set to $A_n$, $B_n$ and $C_n$ respectively which corresponds to the parameters of the sample $Y_n$ compared to the test signal of said period. This comparison has given a result $Q_1 Q_2$ which is stored in the cell $R_n$ of the memory 20 and which is transmitted to the inputs of the flip-flop 43 and 53. At the start of the cycle, the register 81 contains the digital value $Y_n$.

At the start of calculations, a counting pulse CP is delivered along the wire 46 which triggers off the incrementation of the counter 60 by one unity and selectively in the counters 40 and 50 by one unity. The count $C_n'=C_n+1$ of the counter 60 is thus equal to the number of test signal periods for which the synthesized signal S sample has been compared to the test signal T.

Figure 2:
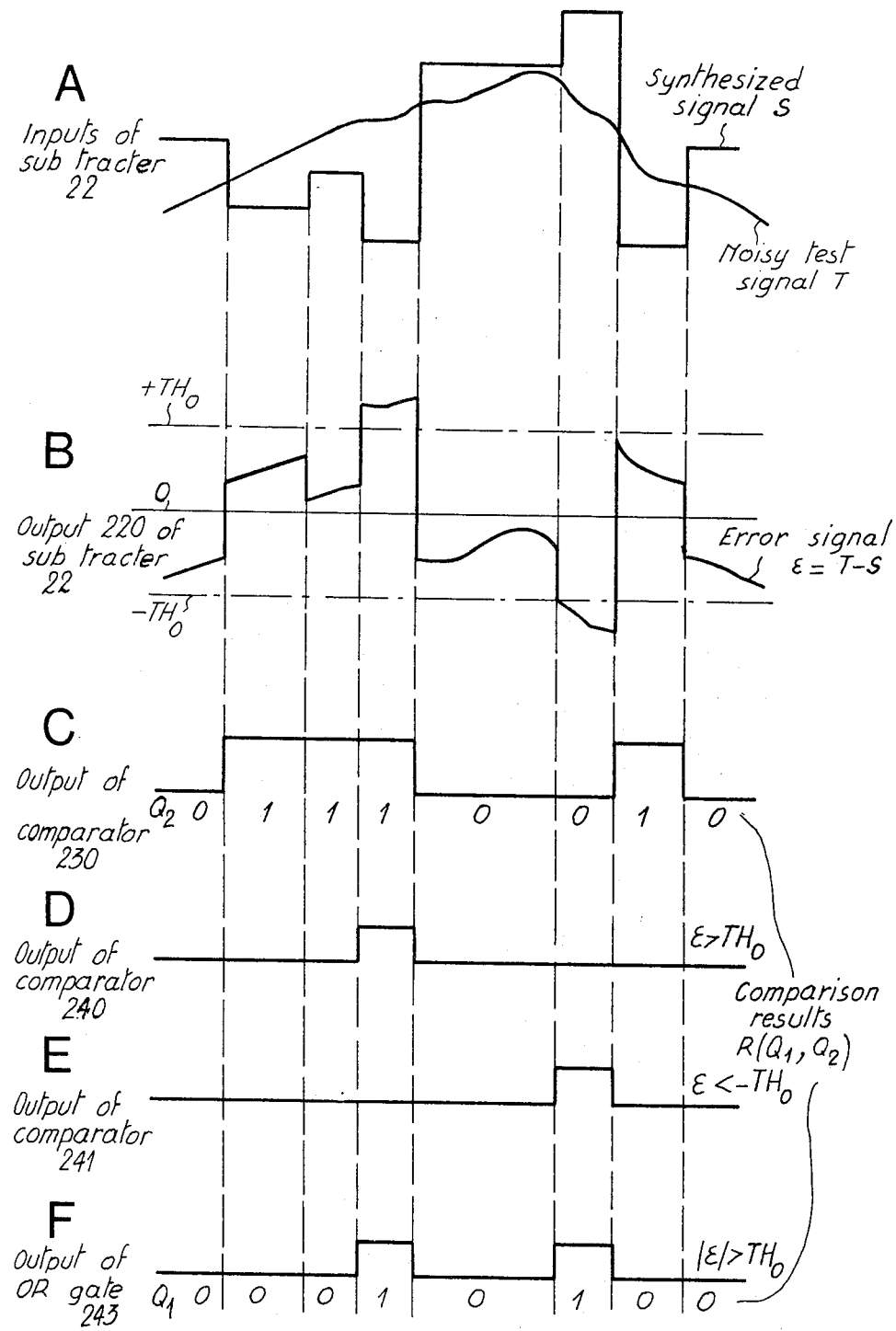
FIG. 2 is a waveform diagram illustrating the various signals obtained following comparisons in the sensor.

According to what was said with reference to FIGS. 1 and 2, $Q_1=1$ means that $|\epsilon|>S_0$ which sets the count of the counter 40 to $A_n'=A_n+1$ and $Q_1=0$ means that $|\epsilon|\leq S_0$ which resets the count in counter 40 to zero ($A_n'=0$) via the AND gate 45. The counter 40 contains thus the number of successive periods where the modulus of the error signal $\epsilon$ for the sample in question is greater than $TH_0$. Likewise, as the output of the flip-flop 53, $Q_2=1$ means that the sample of the error signal $\epsilon$ is positive which increments the count $B_n'=B_n+1$ of the counter 50 by one unity via the AND gate 54. If $Q_2=0$, the count in the counter 50 remains $B_n'=B_n$. The count in the counter 50 thus contains the number of periods where the sample corresponding to the error signal is positive.

The comparator 42 compares the count $A_n'$ of the counter 40 with a first predetermined number $A_0$ which is contained in the register 41. If the state a of the output of the comparator 42 is "1" implying that $A_n'>A_0$, i.e. that the sample of synthesized signal S is statistically very different from that of test signal T ($|\epsilon|$ statistically greater than $TH_0$), then this high difference must be reduced by a high step $\Delta Y$ incrementation. As a result, if $a=1$, the switch 70 is in the fast procedure phase and transfers increment $\Delta Y$ from the register 72 to the input register 80 of the arithmetic and logic unit 8. Equally, if $a=1$, the switch 71 transmits value $Q_2$ to the unit 8. If $Q_2=1$ ($\epsilon>0$), the value $Y_n$ of the sample is much too small and must be increased, which is achieved by the addition $Y_n'=Y_n+\Delta Y$. In the opposite case, i.e. $Q_2=0$ ($\epsilon\leq 0$), the unit 8 carries the subtracting $Y_n'=Y_n-\Delta Y$.

Should $a=0$, implying that $A<A_0$ and that the synthesized signal sample value is to a large extent close to that of the test signal, within the noise fluctuation limits, the sample $Y_n$ value has to be finely adjusted by a small increment $\Delta y$ slow procedure. The switch 70 transfers the content $\Delta y$ of the register 73 over to the input register 80 of the unit 8 and the switch 71 transfers the state b from the first output 520 of the comparators 52 to the unit 8.

In the comparing circuit 5, the register 51 contains an integer number $C_0/2$ equal to half a second predetermined even number $C_0$ which is contained in the register 61. State $b=1$ of the first output 520 of the comparator 52 signifies $B_n'>C_0/2$ and state $b=0$ signifies $B_n'\leq C_0/2$. As a result, for a number of periods $C_n'$ equal to $C_0$, if $b=1$ ($\epsilon$ statistically positive over $C_0$ periods), the addition $Y_n'=Y_n+\Delta y$ is performed in the unit 8, and if $b=0$ ($\epsilon$ statistically negative over $C_0$ periods), the subtraction $Y_n'=Y_n-\Delta y$ is performed. If $b'=1$ ($\epsilon$ statistically zero over $C_0$ periods), gate 93 stays closed and the sample value is not modified ($Y_n'=Y_n$).

In the comparing circuit 6, the output of the comparator 62 stands at $c=1$ if the result of the comparison of the count $C_n'$ of counter 60 with the content $C_0$ of register 61 is such that $C\geq C_0$, and at $c=0$ if $C<C_0$. It can be seen from the connections of gates 90, 91 and 93 that, under the control of a calculation pulse CAP along wire 48, a new value of $Y_n'=Y_n\pm\Delta Y$ or $\pm\Delta y$ is transferred from the register 82 of unit 8 to the register 94, i.e. to the memory 20 of sensor 2, for one of the two following cases:

if $a=1$: the number of successive test signal T periods for which $|\epsilon|>S_0$, is sufficiently high ($\geq A_0$) to justify the modification of $Y_n$ by the first procedure;

if $c=1$: the number of test signal T periods for which sample $Y_n$ has been compared to that of test signal T, is sufficiently high to justify a statistical evaluation of the sign of $\epsilon$ and a modification of $Y_n$ accordingly by the slow procedure.

It can be seen from the connections of the gates 90 and 91 that the calculation pulse CAP decrements the counter 40 by one unity, via AND gate 47, if $a=1$, and also controls the zero-resetting (RS) of the counters 50 and 60, if $a=1$ or $c=1$.

In the other cases, i.e. if $a=0$ or $c=0$, no operation is performed on $Y_n$ and the new value of $Y_n'$ is equal to $Y_n$.

The new value of $Y_n'$ is transmitted to the memory 20 of sensor 2 for the comparison operation during the following test signal T period. This comparison is followed by a further calculation of the sample value based on the value of results $R_n'$ and parameters $Y_n'$, $A_n'$, $B_n'$ and $C_n'$ and so on for each sample using the aforedescribed algorithm.

As a guide, the applicant has achieved a noise reduction of at least 20 dB with an acquisition length of less than 10 s for a synthesized signal which is obtained from a test signal inserted in a video signal having a signal-to-noise ratio of 30 dB, using the following values for the above parameters:

$A_0=16$; $C_0=4$; $\Delta y=16$; $\Delta y=1$ and $S_0=20\times p\times G$ where p is equal to the quantification step in digital-to-analog converter 21 and G the product of the internal gains of the converter 21 and the subtracter 22.

It can be appreciated that the above described embodiments are merely illustrations of the principles of the invention. Other arrangements and modifications may be devised by one skilled in the art without departing from the spirit and scope of the appended claims. This is notably the case for the circuitry in FIGS. 5 and 6 and also for the clock 25 which may be organized around a programmable frequency divider of a conventional type. It will further be noted that the processing unit 1 with microprocessor 10 in FIG. 5 can be designed to manage several sensor 2 which work with different test signals. These test signals can be, in relation to the television systems, the un-filtered test signal, the luminance waveform, the amplitude-detected chrominance waveform, the phase-detected chrominance waveform and the amplitude-detected multi-burst signal waveform.

What I claim is:

1. Device for acquiring and averaging samples of an analog noisy periodic signal whose period is made up of a first portion with a signal and a second portion without, comprising:

means for subtracting said first portion of said noisy signal from analog samples that are precalculated during the preceding second portion of said noisy signal to produce an analog error signal;

means for comparing said error signal with zero, a predetermined voltage threshold and the negative thereof to produce for each sample a first bit representative of the magnitude of the modulus of said error signal in relation to said voltage threshold and a second bit representative of the sign of said error signal;

first means for memorizing at least the precalculated digital values of said samples and said first and second bits;

means for reading and writing in synchronism each sample digital value and the first and second bits resulting from the comparisons at a predetermined recurrent time of said first signal portion;

means for converting said digital values of said samples into said analog samples; and digital means reading the memorized digital value of each sample and the first and second resulting bits for calculating a new sample digital value which is statistically closer to the corresponding amplitude of said periodic signal and for writing said new sample digital value into said first memorising means during at most said second signal portion.

2. Device according to claim 1, wherein said digital calculating means comprises:

first counting and comprising means receiving said first bit related to each sample for selecting a first increment or a second increment depending on whether or not a first number of times where said error signal modulus related to said sample is greater than said voltage threshold throughout consecutive preceding periods, is greater than or strictly less than a first predetermined number;

second counting and comparing means receiving said second bit related to each sample and controlled by said first selecting means for selecting said second bit or a third bit depending on whether said first increment or said second increment is selected, the state of said third bit indicating a second number of times where said error signal related to said sample is strictly greater than or less than half a second predetermined number;

arithmetic means for adding the sample digital value of said sample to or subtracting it from said first increment depending on whether said error signal related to said sample is positive or negative, or for adding the sample digital value of said sample to or subtracting it from said second increment depending on whether said second number of times is strictly greater than or less than half of said second predetermined number, in order to produce said new sample digital value.

3. Device according to claim 2, wherein in said calculating means said second number of times is reset to zero each time said first selecting means selects said first increment or each time third counting and comparing means counts said second predetermined number of consecutive periods of said noisy signal.

4. Device according to claim 2 or 3, wherein in said calculating means said first number of times is reset to zero each time the modulus of said error signal related to said sample is less than said predetermined threshold.

5. Device according to claim 2 or 3, wherein said calculating means comprises means for memorizing at least said first and second number of times during each first period portion of said noisy signal.

6. Device according to claim 2 or 3, wherein said calculating means are organized around a microprocessor 7. Device according to claim 1 or 2 or 3 comprising means for selecting the sampling times of said noisy signal.

8. Device according to claim 7 wherein said sampling time selecting means comprises second means for memorizing the digital values of the time intervals between the successive sampling times, timing means initialized at the start of said first portion of each signal period for producing a clock signal at said sampling times, and means controlled by said clock signal for reading and writing addressing said first memorizing means and for reading addressing said second memorizing means to transmit at least said digital values of said time intervals to said second memorizing means, said addressing means stopping said timing means after a predetermined number of sampling times.

9. Device according to claim 8, wherein said timing means comprises a monostable flip-flop or a loop of a plurality of monostable flip-flops, means for unblocking one of said flip-flops during said predetermined number of said sampling times and means for decoding said digital values of said time intervals read in said second memorizing means to modify at least one characteristic of the time constant of one or several monostable flip-flops in terms of said read digital value of said sampling times, respectively.

* * * * *